(12) United States Patent
Kim

(10) Patent No.: US 8,624,638 B2
(45) Date of Patent: Jan. 7, 2014

(54) SEMICONDUCTOR DEVICE INCLUDING DRIVING CIRCUIT

(75) Inventor: Yong-Mi Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/446,455

(22) Filed: Apr. 13, 2012

(65) Prior Publication Data

US 2013/0162321 A1    Jun. 27, 2013

(30) Foreign Application Priority Data

Dec. 21, 2011    (KR) .......................... 10-2011-0139553

(51) Int. Cl.
*H03K 3/00*    (2006.01)
(52) U.S. Cl.
USPC .......................... 327/108; 327/112

(58) Field of Classification Search
USPC .................................................. 327/108, 112
See application file for complete search history.

(56) References Cited

U.S. PATENT DOCUMENTS

| 6,388,477 B1 * | 5/2002 | Juang ............................ 327/112 |
| 6,690,192 B1 * | 2/2004 | Wing ............................... 326/32 |
| 6,940,321 B2 * | 9/2005 | Heo et al. ....................... 327/112 |
| 7,893,718 B2 * | 2/2011 | Park et al. ....................... 326/83 |

FOREIGN PATENT DOCUMENTS

KR    1020030083237    10/2003

* cited by examiner

*Primary Examiner* — Kenneth B. Wells
(74) *Attorney, Agent, or Firm* — IP & T Group LLP

(57) ABSTRACT

A semiconductor device includes an information generation circuit configured to generate first information, an information multiplexing circuit configured to multiplex the first information and second information, and an information driving circuit configured to drive an output pad in response to an output signal of the information multiplexing circuit.

8 Claims, 2 Drawing Sheets

SEMICONDUCTOR DEVICE INCLUDING DRIVING CIRCUIT

CROSS-REFERENCE TO RELATED APPLICATIONS

The present application claims priority of Korean Patent Application No. 10-2011-0139553, filed on Dec. 21, 2011, which is incorporated herein by reference in its entirety.

BACKGROUND

1. Field

Exemplary embodiments of the present invention relate to a semiconductor designing technology, and more particularly, to a semiconductor device including a driving circuit for outputting specific information.

2. Description of the Related Art

Generally, semiconductor devices including Double Data Rate Synchronous Dynamic Random Access Memory (DDR SDRAM) devices include diverse circuits to perform different operations. The Joint Electron Device Engineering Council (JEDEC) determines a specification for the operations and circuit components of a semiconductor device, and compliant semiconductor devices are designed based on the specification of the JEDEC.

Meanwhile, as the technologies for fabricating and designing semiconductor devices make progress, an operation speed of the semiconductor devices increases, and the semiconductor devices such as DDR2, DDR3 and DDR4 devices have been developed according to operation speeds. As DDR2, DDR3, and DDR4 devices are progressively developed, some semiconductor components may disappear and new components for performing new operations may be added. Here, corresponding specifications determine appropriate circuits and the operations thereof within semiconductor devices.

For example, in case of a DDR4 device, a specification related to Cyclic Redundancy Checks (CRC) and a specification related to command and address parity are added. Further, a specification related to Data Bus Inversion (DBI) and new parameters is added. Semiconductor devices are supposed to perform operations corresponding to the specifications and include circuits corresponding to the operations.

SUMMARY

An embodiment of the present invention is directed to a semiconductor device that outputs internal information required by a specification to an external device.

In accordance with an embodiment of the present invention, a semiconductor device includes an information generation circuit configured to generate first information, an information multiplexing circuit configured to multiplex the first information and second information, and an information driving circuit configured to drive an output pad in response to an output signal of the information multiplexing circuit.

In accordance with another embodiment of the present invention, a semiconductor device includes a first driving circuit configured to drive an output pad in response to first information in a first operation mode that uses the first information, and a second driving circuit configured to be enabled along with the first driving circuit and drive the output pad in a second operation mode that does not use the first information.

In accordance with yet another embodiment of the present invention, a semiconductor device includes a first driving circuit configured to drive an output pad in response to first information in an operation mode using the first information, and a second driving circuit configured to precharge the output pad in response to a precharge control signal.

The semiconductor device in accordance with an embodiment of the present invention may output internal information to an external device, and the semiconductor device may use a driving circuit for outputting the internal information to perform an operation other than the operation of outputting the internal information.

DETAILED DESCRIPTION

Figure 1:
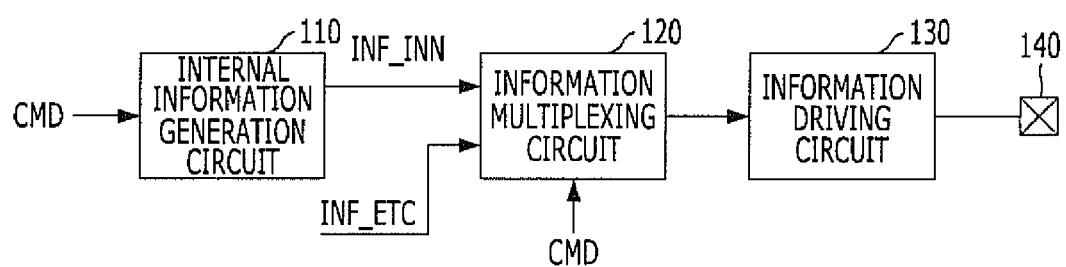
FIG. 1 is a block diagram illustrating a portion of a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a portion of a semiconductor device in accordance with an embodiment of the present invention.

Referring to FIG. 1, the semiconductor device includes an internal information generation circuit 110, an information multiplexing circuit 120, and an information driving circuit 130.

The internal information generation circuit 110 generates internal information INF_INN. The internal information generation circuit 110 generates the internal information INF_INN in response to a command signal CMD for outputting the internal information INF_INN. The information multiplexing circuit 120 multiplexes the internal information INF_INN and other information INF_ETC. The information multiplexing circuit 120 outputs the internal information INF_INN or the other information INF_ETC in response to the command signal CMD. The other information INF_ETC means information that is different from the internal information INF_INN. Subsequently, the information driving circuit 130 drives an output pad 140 in response to an output signal of the information multiplexing circuit 120.

Hereinafter, the operation of the semiconductor device in accordance with the embodiment of the present invention is briefly described.

First, in an operation mode using the internal information INF_INN, which is referred to as a first operation mode hereinafter, the internal information generation circuit 110 generates internal information INF_INN in response to a command signal CMD corresponding to the first operation mode. The internal information INF_INN means information specified in, for example, a specification. For example, the internal information INF_INN may be information related to Cyclic Redundancy Checks (CRC) or information related to a command/address parity. In other words, the internal information INF_INN may be information about an error detected in a signal transferred through a signal transfer line. Subsequently, the information multiplexing circuit 120 transfers the internal information INF_INN to the information driving circuit 130 in response to the command signal CMD, and the information driving circuit 130 outputs the internal information INF_INN to the output pad 140.

Subsequently, in an operation mode that is not the operation mode using the internal information INF_INN, which is referred to as a second operation mode hereinafter, the information multiplexing circuit 120 transfers other information INF_ETC to the information driving circuit 130 in response to a command signal CMD corresponding to the second operation mode, and the information driving circuit 130 outputs the other information INF_ETC to the output pad 140.

Figure 2:
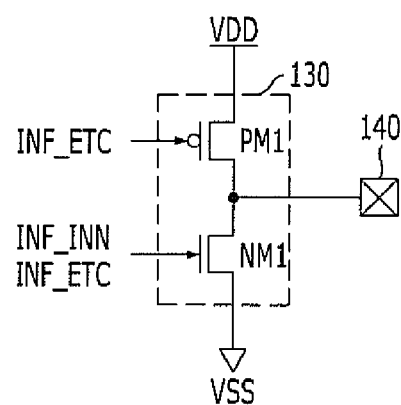
FIG. 2 is a circuit diagram illustrating an information driving unit 130 of the semiconductor device shown in FIG. 1 in accordance with a first embodiment of the present invention.

FIG. 2 is a circuit diagram illustrating the information driving circuit 130 of the semiconductor device shown in FIG. 1 in accordance with a first embodiment of the present invention.

Referring to FIG. 2, the information driving circuit 130 includes a PMOS transistor PM1 and an NMOS transistor NM1. The PMOS transistor PM1 has a source-drain path formed between a power source voltage VDD terminal and the output pad 140 in response to an output signal of the information multiplexing circuit 120. The NMOS transistor NM1 has a source-drain path between the output pad 140 and a ground voltage VSS terminal in response to an output signal of the information multiplexing circuit 120. The PMOS transistor PM1, which is a pull-up driver, may receive only the other information INF_ETC, whereas the NMOS transistor NM1, which is a pull-down driver, may receive both of the other information INF_ETC and the internal information INF_INN.

Therefore, the semiconductor device in accordance with the first embodiment of the present invention generates the internal information INF_INN of a logic high level in the first operation mode, and the NMOS transistor NM1 pull-down drives the output pad 140 in response to the internal information INF_INN. Also, the PMOS transistor PM1 and the NMOS transistor NM1 pull-up or pull-down drives the output pad 140 in response to the other information INF_ETC during the second operation mode. Thus, the NMOS transistor NM1 is enabled in the first operation mode, and both PMOS transistor PM1 and NMOS transistor NM1 are enabled in the second operation mode.

As described above, the semiconductor device in accordance with the first embodiment of the present invention may use the NMOS transistor NM1 that outputs the internal information INF_INN as a driving circuit for outputting the other information INF_ETC other than the internal information INF_INN. This means that the utility efficiency of a driving circuit increases.

Figure 3:
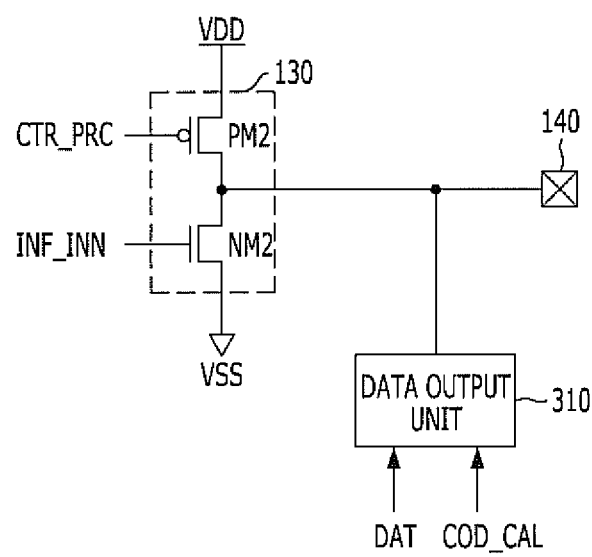
FIG. 3 is a circuit diagram illustrating an information driving unit 130 of the semiconductor device shown in FIG. 1 in accordance with a second embodiment of the present invention.

FIG. 3 is a circuit diagram illustrating the information driving unit 130 of the semiconductor device shown in FIG. 1 in accordance with a second embodiment of the present invention. In the second embodiment, a case where the output pad 140 is precharged with a positive voltage applied from an external controller or an internal circuit is illustrated.

Referring to FIG. 3, the information driving circuit 130 includes a PMOS transistor PM2 and an NMOS transistor NM2. The PMOS transistor PM2 pull-up drives and pre-charges the output pad 140 in response to a precharge control signal CTR_PRC. The NMOS transistor NM2 pull-down drives the output pad 140 in response to internal information INF_INN.

Hereinafter, the circuit operation is described briefly. The NMOS transistor NM2 pull-down drives the output pad 140 in response to the internal information INF_INN of a logic high level. The PMOS transistor PM2 then pre-charges the output pad 140 in response to the precharge control signal CTR_PRC. The NMOS transistor NM2 and the PMOS transistor PM2 have different operation periods, respectively. For example, the precharge operation is performed before or after an operation using specified information.

As described above, the semiconductor device in accordance with the second embodiment of the present invention may precharge the output pad 140 faster than semiconductor devices fabricated according to other technologies, which means that the timing point for performing another operation after the internal information INF_INN is outputted may arrive faster.

Referring back to FIG. 3, the output pad 140 is coupled with a data output unit 310. The data output unit 310 is a circuit for outputting internal data DAT to an external device. The data output unit 310 performs a calibration operation on the output pad 140 in response to a calibration code COD_CAL. The driving circuit 130 including the PMOS transistor PM2 and the NMOS transistor NM2 in accordance with the second embodiment of the present invention operates independently from the data output unit 310.

As described above, the semiconductor device in accordance with the second embodiment of the present invention includes a driving circuit for outputting the internal information INF_INN specified by, for example, a specification, and the driving circuit may output the other information INF_ETC or perform a precharge operation.

According to an embodiment of the present invention, a semiconductor device may output internal information specified by, for example, a specification to an external device and thereby maximize the efficiency of a driving circuit for outputting the internal information.

While the present invention has been described with respect to the specific embodiments, it will be apparent to those skilled in the art that various changes and modifications may be made without departing from the spirit and scope of the invention as defined in the following claims.

Meanwhile, although the embodiments of the present invention exemplarily illustrate a case where a driving circuit for outputting internal information INF_INN may output other information INF_ETC or perform a precharge operation, the technology of the present invention may be applied to perform a termination operation or other various operations other than the precharge operation or other information output operation.

The positions and kinds of the logic gates and transistors illustrated in the above embodiments may be realized differently according to the polarity of an input signal.

What is claimed is:

1. A semiconductor device, comprising:
    an information generation circuit configured to generate first information;
    an information multiplexing circuit configured to multiplex the first information and second information; and
    an information driving circuit configured to drive an output pad in response to an output signal of the information multiplexing circuit,
    wherein the information generation circuit is configured to detect an error of a signal transferred through a signal transfer line.

2. The semiconductor device of claim 1, wherein the information driving circuit comprises:
   a first driving unit and a second driving unit configured to drive the output pad in response to an output signal of the information multiplexing circuit, and
   when the first information is transferred to the information driving circuit, one of the first driving unit and the second driving unit is enabled.

3. The semiconductor device of claim 2, wherein the first driving unit and the second driving unit are configured to be exclusively enabled in response to a logic level of the second information when the second information is transferred to the information driving circuit.

4. The semiconductor device of claim 2, wherein the first driving unit is configured to be pull-down driven, and the second driving unit is configured to be pull-up driven.

5. The semiconductor device of claim 1, further comprising:
   a data output unit configured to receive and output internal data and perform a calibration operation on the output pad in response to a calibration code.

6. A semiconductor device, comprising:
   a first driving circuit configured to drive an output pad in response to first information in a first operation mode that uses the first information; and
   a second driving circuit configured to be enabled along with the first driving circuit and drive the output pad in a second operation mode that does not use the first information, wherein the first information includes information about an error detected from a signal that is transferred through a signal transfer line.

7. The semiconductor device of claim 6, wherein the first driving circuit is configured to be pull-down driven, and the second driving circuit is configured to be pull-up driven.

8. The semiconductor device of claim 6, further comprising:
   a data output unit configured to receive and output internal data and perform a calibration operation on the output pad in response to a calibration code.

* * * * *